(12) United States Patent
Nakajima

(10) Patent No.: US 9,778,287 B2
(45) Date of Patent: Oct. 3, 2017

(54) CURRENT SENSOR

(71) Applicant: SUMITOMO WIRING SYSTEMS, LTD., Yokkaichi, Mie (JP)

(72) Inventor: Hirokatsu Nakajima, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 6 days.

(21) Appl. No.: 14/433,801

(22) PCT Filed: Mar. 22, 2013

(86) PCT No.: PCT/JP2013/058230
§ 371 (c)(1),
(2) Date: Apr. 6, 2015

(87) PCT Pub. No.: WO2014/064950
PCT Pub. Date: May 1, 2014

(65) Prior Publication Data
US 2015/0276814 A1 Oct. 1, 2015

(30) Foreign Application Priority Data
Oct. 25, 2012 (JP) ................................. 2012-235810

(51) Int. Cl.
*G01R 15/14* (2006.01)
*G01R 15/20* (2006.01)

(52) U.S. Cl.
CPC ......... *G01R 15/148* (2013.01); *G01R 15/202* (2013.01); *G01R 15/207* (2013.01)

(58) Field of Classification Search
CPC ............................ G01R 15/202; G01R 15/148
See application file for complete search history.

(56) References Cited

U.S. PATENT DOCUMENTS

| 2004/0080308 A1* | 4/2004 | Goto ................. G01R 19/0092 324/117 H |
| 2007/0279053 A1* | 12/2007 | Taylor .................. G01R 15/207 324/252 |
| 2009/0128129 A1* | 5/2009 | Aratani ................ G01R 15/207 324/117 H |

(Continued)

FOREIGN PATENT DOCUMENTS

| JP | H03-85614 A | 4/1991 |
| JP | 2010-071822 A | 4/2010 |

OTHER PUBLICATIONS

Jul. 2, 2013 International Search Report issued in PCT/JP2013/058230.

*Primary Examiner* — Patrick Assouad
*Assistant Examiner* — Haidong Zhang
(74) *Attorney, Agent, or Firm* — Oliff PLC

(57) ABSTRACT

Provided is a current sensor capable of being assembled even if a bus bar inserted through a magnetic core has a complex shape that is difficult to insert through an opening portion of a case. A case includes a first case segment and a second case segment provided with opening portions having a cut-out shape that is open toward a direction orthogonal to a direction in which a detection target portion of a bus bar extends, and the case is assembled to the detection target portion by inserting the detection target portion into the opening portions from the direction orthogonal to the direction in which the detection target portion extends.

8 Claims, 7 Drawing Sheets

(56) References Cited

U.S. PATENT DOCUMENTS

2011/0288799 A1\* 11/2011 Cortes ................. G01R 15/207
                                                              702/65
2013/0113463 A1   5/2013  Fukuyama et al.
2013/0193954 A1   8/2013  Nakajima et al.

\* cited by examiner

CURRENT SENSOR

TECHNICAL FIELD

The exemplary embodiments relate to a current sensor for detecting a current flowing through a conductor, and a current sensor for detecting a current flowing through a bus bar serving as a conductor.

BACKGROUND ART

Conventionally, a current sensor has been used to detect a charging/discharging current of a battery of a car and to detect a current flowing between a battery and an inverter of a hybrid car or an electric car. As described in JP 2012-47563A, the current sensor has a structure in which a conductor such as a bus bar is inserted through an annular magnetic core and a magneto-electric conversion element such as a Hall element is disposed in a gap formed by cutting out a portion of the circumference of the magnetic core. The magneto-electric conversion element converts a magnetic flux generated by current flowing through the conductor into voltage signals, and thus the current flowing through the conductor is detected.

Incidentally, in such a current sensor, it is necessary to insert the conductor in which a current is to be detected through the magnetic core accommodated in a case through an opening portion of the case. However, it is often difficult to insert the bus bar through the opening portion of the case, as the bus bar has a complicated shape that sometimes has a width dimension that is larger than that of the opening portion or is sometimes provided with a large number of bent portions.

Therefore, conventionally, as described in JP 2012-47563A as well, the current sensor for detecting a current flowing through the bus bar has a structure in which a detection target portion of the bus bar to be inserted through the magnetic core is separately formed and projects from the case, and both ends of the detection target portion of the bus bar that project from the case are connected to another bus bar.

However, in the structure as described in JP 2012-47563A, heat is generated due to contact resistance between the bus bar that projects from the case and another bus bar that is connected thereto in the portions in which the bus bars are connected to each other. Then, there is a risk that the heat generation due to the contact resistance between the bus bars affects the magneto-electric conversion element, and thus the detection accuracy is lowered. Moreover, the contact resistance depends on the tightening torque of a bolt for fixing the bus bars to each other, and therefore, there is a problem in that it is necessary to accurately control the tightening torque of the bolt and thus production man-hours increase.

SUMMARY

Technical Problem

The exemplary embodiments were derived in view of the foregoing circumstances, and it is an object thereof to provide a current sensor having a structure that can be assembled even if a bus bar to be inserted through a magnetic core has a complex shape that is substantially difficult to insert through an opening portion of a case.

Solution to Problem

A first aspect of the exemplary embodiments is a current sensor having a case accommodating an annular magnetic core that is provided with a gap portion formed by cutting out a portion of the circumference, and a magneto-electric conversion element that is disposed in the gap portion and that detects a magnetic flux changing depending on a current flowing through a detection target portion of a bus bar that is inserted through the magnetic core, the detection target portion of the bus bar projecting from the case through an opening portion formed in the case, wherein the case comprises a first case segment and a second case segment that are assembled to each other, the magnetic core being interposed between the first and the second case segment, at least one of the first case segment and the second case segment is provided with the opening portion, the opening portion having a cut-out shape that is open toward a direction orthogonal to a direction in which the detection target portion extends, the detection target portion of the bus bar is arranged to pass through the magnetic core by inserting the detection target portion through the gap portion of the magnetic core, and the first case segment and the second case segment are assembled to each other by inserting the detection target portion into the opening portion in a direction orthogonal to the direction in which the detection target portion extends.

In the exemplary embodiments, the opening portion of the case through which the detection target portion of the bus bar is inserted is formed to have a cut-out shape that is open toward a direction orthogonal to the direction in which the detection target portion extends. The detection target portion of the bus bar is inserted through the magnetic core through the gap portion of the magnetic core and the detection target portion is inserted into a cutout of the opening portion of the case segment from the direction orthogonal to the direction in which the detection target portion extends, and thus the detection target portion can be inserted through the opening portion. Accordingly, even if the bus bar has a bent portion or a wide portion that is larger than the opening portion, the current sensor can be assembled by inserting the detection target portion through the opening portion of the case and the magnetic core. Thereby, it becomes unnecessary to form only the detection target portion of the bus bar as a separate structure and to connect it to another bus bar. As a result, it is possible to prevent the problem of the heat generation due to the contact resistance between the bus bars and to highly secure the detection accuracy of the magneto-electric conversion element. Moreover, it becomes unnecessary to control the contact pressure between the bus bars, and therefore, it is possible to reduce production man-hours.

It should be noted that the opening portion may be formed in only either one of the first case segment and the second case segment. For example, the first case segment and the second case segment may be assembled to each other from both directions orthogonal to the central axis of the magnetic core, and only the first case segment may be provided with the opening portion having a cut-out shape that is open toward the second case segment. While the magnetic core through which the detection target portion has been inserted is interposed between the first case segment and the second case segment from both directions on the outer circumferential side, the detection target portion may be inserted into the opening portion of the first case segment, and the opening of the cutout of the opening portion may be blocked by the second case segment, for example.

In a second aspect of the exemplary embodiments according to the first aspect, the first case segment and the second case segment are assembled to each other, the magnetic core being interposed between the first and the second case segment in the direction in which the detection target portion of the bus bar extends, and both of the first case segment and the second case segment are provided with said opening portions, the respective opening portions being open toward directions that are opposite to each other and orthogonal to the direction in which the detection target portion extends, and the first case segment and the second case segment are assembled to each other by inserting the detection target portion into the opening portions from mutually opposite sides interposing the detection target portion in the direction orthogonal to the direction in which the detection target portion extends.

In this aspect, by interposing the magnetic core between the first case segment and the second case segment from both sides in the axis direction, it is possible to stably hold the magnetic core. Moreover, the opening portion of the first case segment and the opening portion of the second case segment are open toward the directions opposite to each other, and therefore, by interposing the detection target portion between the first case segment and the second case segment from the mutually opposite sides, it is possible to prevent the case from being dislodged from the detection target portion.

A third aspect of the exemplary embodiments according to the first or second aspect further includes the bus bar, the bus bar having connecting portions that are integrally formed on both sides of the detection target portion, and conductive paths connecting the connecting portions and the detection target portion, the conductive paths being larger than the opening portions of the case in a projection view in the direction in which the detection target portion extends.

In this aspect, the current sensor is configured to include a bus bar larger than the opening portion of the case. Since the detection target portion and the connecting portions are formed integrally with the bus bar, it becomes unnecessary to connect the detection target portion to other bus bars in which connecting portions are formed, and thus it is possible to prevent the heat generation due to the contact resistance between the bus bars. Moreover, the connecting portions of the bus bar are separated from the detection target portion with the conductive paths being disposed therebetween, and therefore, it is also possible to reduce the risk that the heat generated in the connecting portions is transferred to the detection target portion.

A fourth aspect of the exemplary embodiments according to any one of the first to third aspects further includes the bus bar including the detection target portion, the detection target portion being provided with raised portions that are raised from the detection target portion and extend in the direction in which the detection target portion extends.

With this aspect, by forming the raised portions in the detection target portion of the bus bar, the surface area and the conductive cross-sectional area of the detection target portion are made larger. Thereby, it is possible to more effectively suppress a rise in temperature of the detection target portion. Moreover, by forming the raised portions, a space is formed between the case through which the detection target portion is inserted and the detection target portion. The detection target portion is brought into contact with air in the space and the more amount of contact between the detection target portion and air is secured, and thus it is possible to attain a better heat-radiating effect.

Advantageous Effects

In the exemplary embodiments, the opening portion is formed in at least one of the first case segment and the second case segment that constitute the case so as to have a cut-out shape that is open toward a direction orthogonal to a direction in which the detection target portion of the bus bar extends. It is possible to insert the detection target portion through the opening portion by inserting the detection target portion thereinto from a side of the opening of the cutout. Thereby, even if the bus bar is larger than the opening portion, it is possible to assemble the current sensor by inserting the detection target portion through the case and the magnetic core. As a result, it becomes unnecessary to connect the detection target portion to other bus bars, and thus it is possible to prevent the heat generation due to the contact resistance between the bus bars and to maintain the detection accuracy.

DESCRIPTION OF EMBODIMENTS

Hereinafter, an exemplary embodiment will be described with reference to the drawings.

Figure 1:
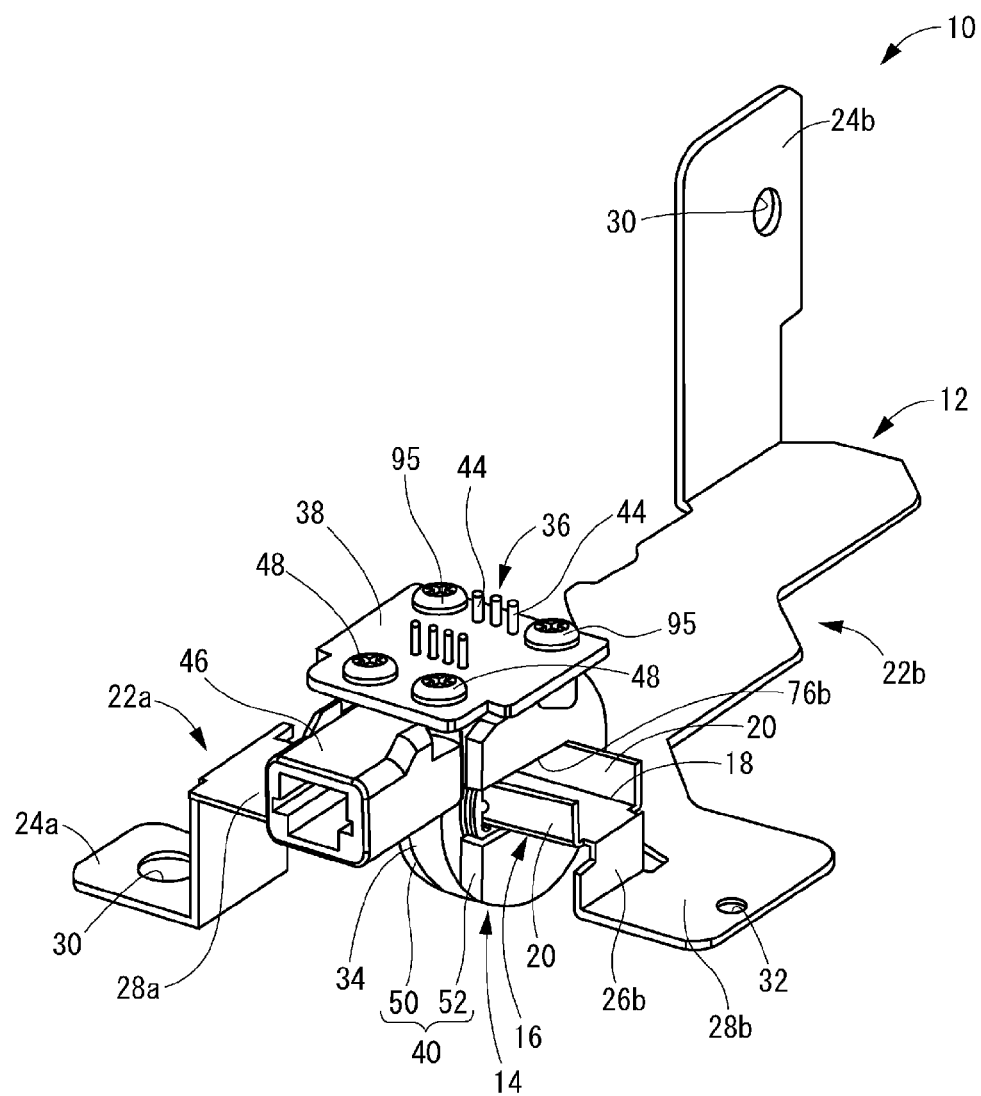
FIG. 1 is a perspective view of a current sensor according to an exemplary embodiment.
Figure 2:
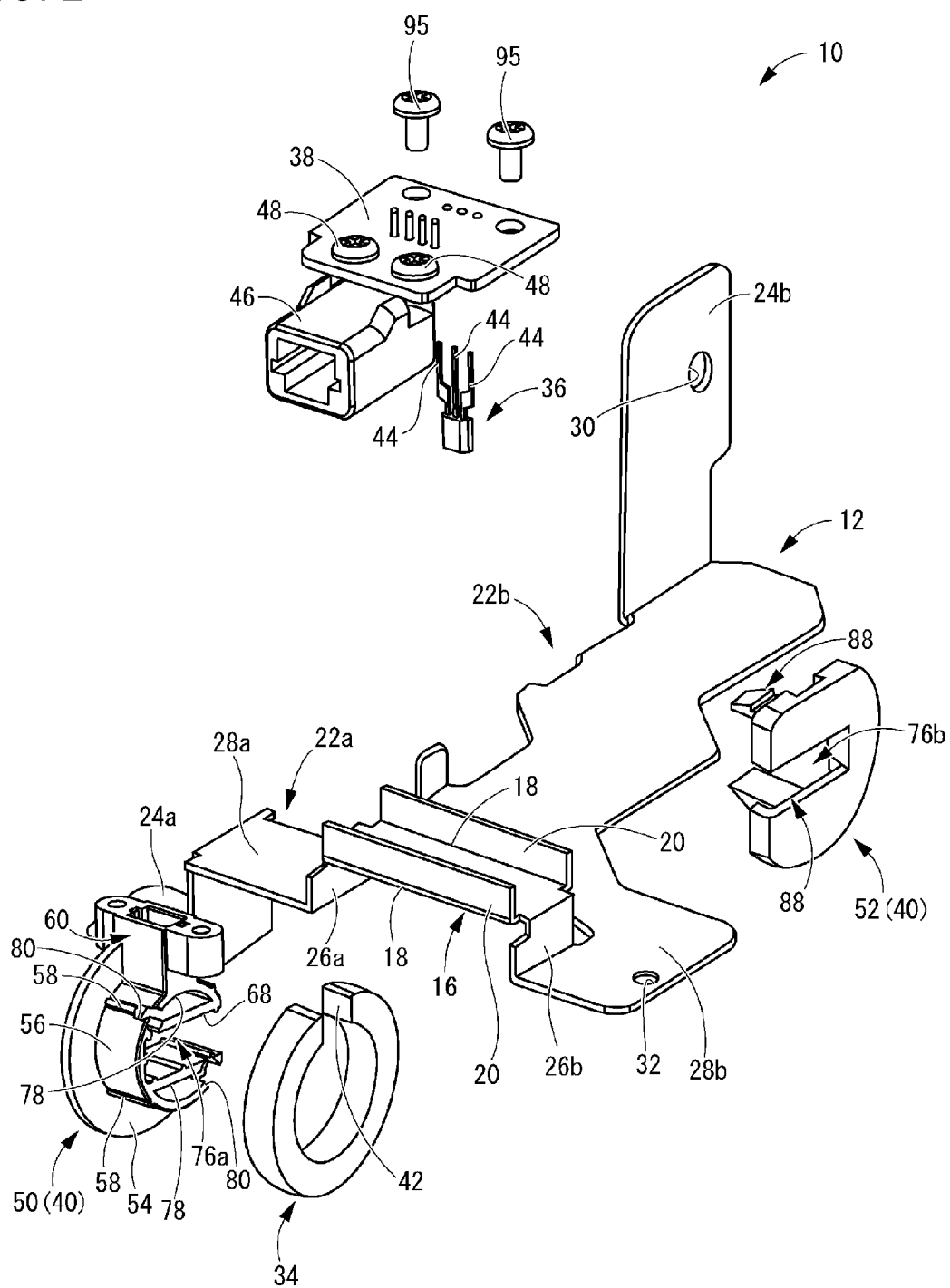
FIG. 2 is an exploded perspective view of the current sensor shown in FIG. 1.

First, FIG. 1 and FIG. 2 show a current sensor 10 according to an exemplary embodiment. The current sensor 10 has a structure in which a sensor body 14 is assembled to a bus bar 12, and is configured to include the bus bar 12. For example, the bus bar 12 of the current sensor 10 is attached to a battery pack, a junction box, or the like.

Figure 3:
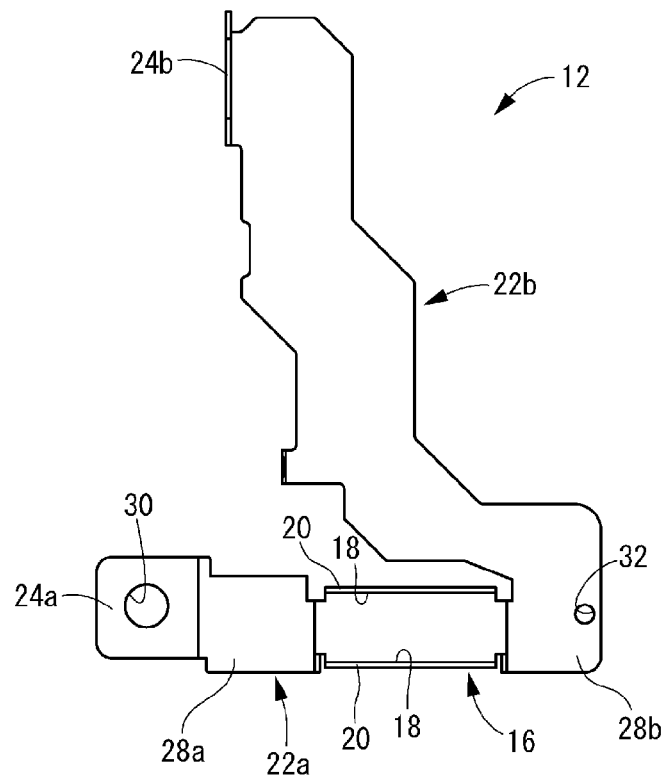
FIG. 3 is a plan view of a bus bar.

FIG. 3 shows the bus bar 12. The bus bar 12 is an integrally shaped article formed by, for example, bending a punched metal plate. As a shape of the bus bar 12, any shape can be set depending on the required routing configuration of the electric circuit, or the like. The bus bar 12 of this embodiment is provided with a detection target portion 16 that extends with a certain width dimension (dimension in the vertical direction in FIG. 3). The detection target portion 16 is provided with a pair of raised portions 20 that is bent along bending lines 18 extending in the direction in which the detection target portion 16 extends at both edge portions in the width direction (vertical direction in FIG. 3) to be raised at a right angle. It should be noted that the raised portions 20 are set so as to have a height dimension with which they can be inserted through a gap portion 42 of a magnetic core 34, which will be described later. Thereby, the detection target portion 16 extends with a U-shaped cross section.

Conductive paths 22a and 22b extend from both sides of the detection target portion 16 in the bus bar 12, and the extending end portions of conductive paths 22a and 22b are provided with connecting portions 24a and 24b, respectively. The portion in which the conductive path 22a and the detection target portion 16 are connected to each other is provided with a bent portion 26a that is bent at a right angle with the detection target portion 16. Furthermore, a wide portion 28a having a width dimension (dimension in the vertical direction in FIG. 3) that is larger than that of the detection target portion 16 is formed between the connecting portion 24a and the bent portion 26a in the conductive path 22a. Moreover, the connecting portion 24a is formed to have a flat plate shape in which a bolt hole 30 is provided so as to penetrate the central portion thereof. The bolt hole 30 is used to fix a connecting terminal (not shown) provided at the end of a wire harness from a battery to the connecting portion 24a by a bolt, for example. On the other hand, the portion in which the conductive path 22b and the detection target portion 16 are connected to each other is also provided with a bent portion 26b similar to the bent portion 26a. Furthermore, a wide portion 28b having a width dimension (dimension in the vertical direction in FIG. 3) that is larger than that of the detection target portion 16 is formed between the connecting portion 24b and the bent portion 26b in the conductive path 22b. It should be noted that a positioning hole 32 into which a projection of an electric junction box (not shown) is inserted is disposed so as to penetrate the wide portion 28b. Moreover, the conductive path 22b extends in a direction orthogonal to the direction in which the detection target portion 16 extends (horizontal direction in FIG. 3), and the extending end thereof is provided with the connecting portion 24b, which has a flat panel shape and is raised at a right angle. A bolt hole 30 is provided so as to penetrate the connecting portion 24b and is used to fix a connecting terminal (not shown) provided at the end of a wire harness to be connected to an electric component to the connecting portion 24b by a bolt, for example. In this manner, the conductive paths 22a and 22b disposed continuously from the detection target portion 16 are provided with the bent portions 26a and 26b that are bent with respect to the detection target portion 16 and the wide portions 28a and 28b that have width dimensions larger than that of the detection target portion 16, and are made larger than opening portions 76a and 76b of a case 40, which will be described later, in a projection view in the direction in which the detection target portion 16 extends (horizontal direction in FIG. 3). Accordingly, the bus bar 12 has a size with which it cannot be inserted through the opening portions 76a and 76b in the direction in which the detection target portion 16 extends.

The sensor body 14 is assembled to the detection target portion 16 of this bus bar 12. As shown in FIG. 2, the sensor body 14 is configured to include the magnetic core 34, a circuit board 38 including a Hall element 36 as a magneto-electric conversion element, and the case 40 to which the magnetic core 34 and the circuit board 38 are assembled.

The magnetic core 34 is formed of ferrite, silicon steel, or the like. The magnetic core 34 has an annular shape as a whole. The magnetic core 34 is provided with the gap portion 42 formed by cutting out a portion of the circumference.

The Hall element 36 is an example of the magneto-electric conversion element capable of converting the intensity of magnetic field to voltage signals. A plurality of connecting terminals 44 for power input/detection signal output project from the Hall element 36.

The Hall element 36 is mounted on the circuit board 38 with the connecting terminals 44. A circuit for supplying power to the Hall element 36, a circuit for amplifying the detection signals of a magnetic flux outputted from the Hall element 36, a connector 46 and the like are mounted on the circuit board 38. The connector 46 is fixed to the circuit board 38 by bolts 48 and is electrically connected to the Hall element 36 via the circuit provided on the circuit board 38. Thereby, the sensor body 14 can output current detection signals to an external circuit such as an electronic control unit through electric wires (not shown) connected to the connector 46.

Figure 4:
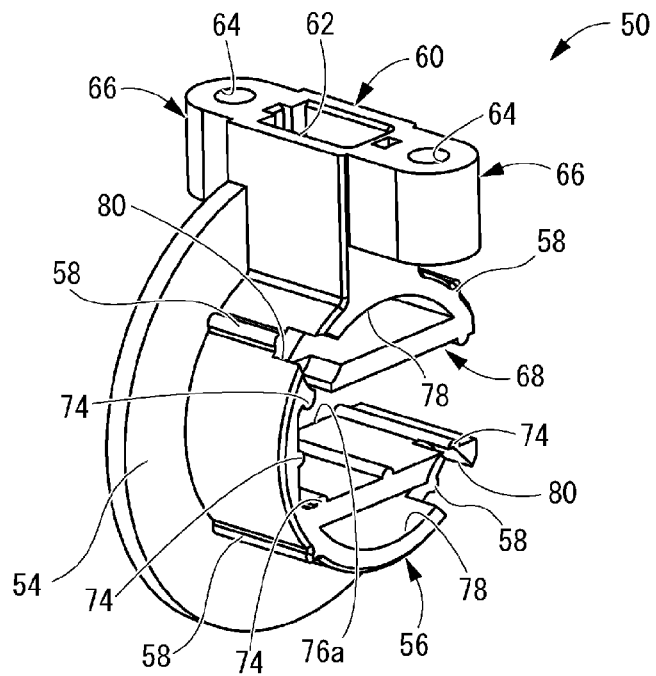
FIG. 4 is a perspective view of a first case segment.
Figure 5:
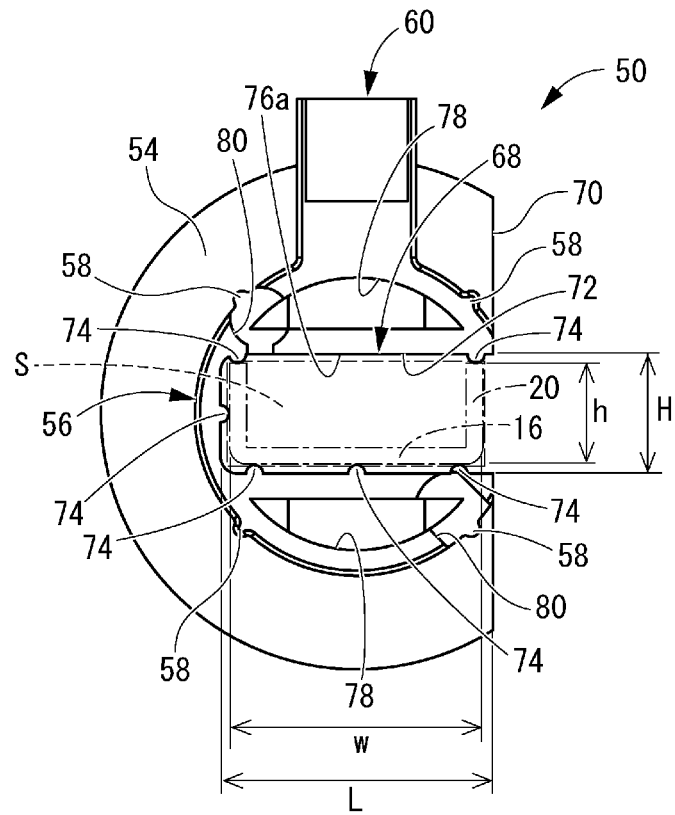
FIG. 5 is a side view of the first case segment shown in FIG. 4.

The case 40 is formed by assembling a first case segment 50 and a second case segment 52 together. FIG. 4 and FIG. 5 show the first case segment 50. The first case segment 50 is an integrally molded article formed of a synthetic resin. The first case segment 50 has a shape in which a supporting portion 56 having a substantially cylindrical shape projects from a disk portion 54 having a partial disk shape in which a disk having substantially the same size as the outer diameter dimension of the magnetic core 34 is cut along a predetermined chord. The supporting portion 56 has a substantially cylindrical shape having a diameter dimension slightly smaller than that of the inner circumferential surface of the magnetic core 34, and is formed on the same central axis as the disk portion 54. The projection dimension of the supporting portion 56 from the disk portion 54 is made slightly larger than the dimension in the axial direction of the magnetic core 34. The outer surface of the supporting portion 56 is provided with a plurality of core-supporting ribs 58 extending in the axial direction of the supporting portion 56 at appropriate positions in the circumferential direction. The core-supporting ribs 58 are preferably spaced equally in the circumferential direction of the supporting portion 56, and in this embodiment, four core-supporting ribs 58 are formed at every quarter circumference in the circumferential direction of the supporting portion 56.

Moreover, the first case segment 50 is provided with a substrate-attaching portion 60 projecting from the supporting portion 56 toward the outside in the radial direction of the supporting portion 56. The substrate-attaching portion 60 projects from the supporting portion 56 in the radial direction of the disk portion 54 to the outside of the disk portion 54, and projects toward both sides in the axial direction of the supporting portion 56 at the projecting front end portion thereof. The substrate-attaching portion 60 has a width dimension (dimension in the horizontal direction in FIG. 5) slightly smaller than the gap portion 42 of the magnetic core 34. The central portion of the substrate-attaching portion 60 is provided with an element-accommodating portion 62 having a recessed shape that is open toward the outside of the first case segment 50. Bolt-fixing portions 66 provided with a bolt hole 64 are formed on both sides interposing the element-accommodating portion 62 in the substrate-attaching portion 60.

Furthermore, a hollow insertion hole 68 is provided so as to penetrate the central portion of the first case segment 50. The hollow insertion hole 68 extends with a rectangular cross section in the axial direction of the supporting portion 56. As shown in FIG. 5, the rectangular cross section of the hollow insertion hole 68 has a rectangular shape in which the dimension L in the longitudinal direction is larger than the width dimension w of the detection target portion 16 of the bus bar 12 and the dimension H in the short-length direction is larger than the vertical dimension h of the raised portion 20 of the detection target portion 16. Thereby, the cross section of the hollow insertion hole 68 has a cross-sectional shape having a larger size than that of a rectangular region S surrounding the entire cross section of the detection target portion 16.

It should be noted that one side in the longitudinal direction (right side in FIG. 5) of the hollow insertion hole 68 is open toward a straight edge portion 70 of the disk portion 54, and the other three sides thereof are surrounded by an inner surface 72. The inner surface 72 of the hollow insertion hole 68 is provided with a plurality of bus bar-supporting ribs 74 extending in the direction in which the hollow insertion hole 68 extends at appropriate positions in the circumferential direction.

This hollow insertion hole 68 penetrates the disk portion 54 from the supporting portion 56, and thus the first case segment 50 is provided with the opening portion 76a. Thereby, the opening portion 76a is open on the disk portion 54 in a rectangular shape, and has a cut-out shape that is open toward the straight edge portion 70 side. The cutout of the opening portion 76a is open toward a direction orthogonal to the direction in which the detection target portion 16 extends (horizontal direction in FIG. 3) in a state where the first case segment 50 is assembled to the detection target portion 16.

Moreover, lock insertion holes 78 penetrating the disk portion 54 and the supporting portion 56 are formed on both sides interposing the hollow insertion hole 68 inside the supporting portion 56. Furthermore, a pair of positioning recessed portions 80 is formed at the outer circumferential edge portion of the supporting portion 56. The positioning recessed portions 80 are formed at the positions opposed to each other in the radial direction of the supporting portion 56.

Figure 6:
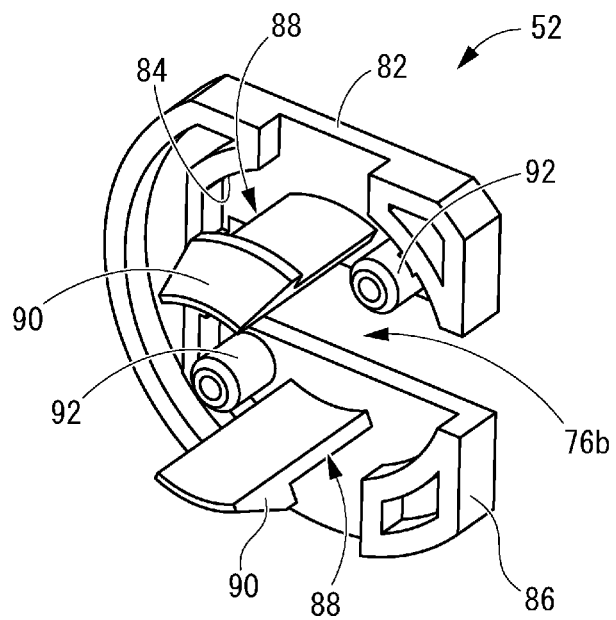
FIG. 6 is a perspective view of a second case segment.

On the other hand, FIG. 6 shows the second case segment 52. The second case segment 52 is an integrally molded article formed of a synthetic resin. The second case segment 52 has a disk portion 82 having a partial disk shape in which a disk having substantially the same size as the disk portion 54 of the first case segment 50 is cut along two chords extending in the directions orthogonal to each other. The central portion of the disk portion 82 is provided with a fitting recess 84 in a recessed shape that has substantially the same shape as the contour of the projecting end surface of the supporting portion 56 in the first case segment 50.

The opening portion 76b is provided so as to penetrate the disk portion 82 of the second case segment 52. The opening portion 76b has a rectangular shape having the same size as the opening portion 76a of the first case segment 50. The opening portion 76b has a cut-out shape that is open toward a straight edge portion 86 of the disk portion 82. The straight edge portion 86 of the disk portion 82 is formed on the side opposite to the straight edge portion 70 of the first case segment 50 in a state where the first case segment 50 and the second case segment 52 are assembled to each other. Accordingly, in a state where the second case segment 52 is assembled to the detection target portion 16, the cutout of the opening portion 76b is open toward a direction orthogonal to the direction in which the detection target portion 16 extends, and toward a direction that is orthogonal to the direction in which the detection target portion 16 extends and opposite to the direction toward which the opening portion 76a of the first case segment 50 is open.

Moreover, the disk portion 82 is provided with locking pieces 88 at positions corresponding to the lock insertion holes 78 of the first case segment 50. The locking pieces 88 each have a shape of a projecting piece that projects from the disk portion 82 toward the first case segment 50 side, and the front end portion projecting from the disk portion 82 is provided with a locking claw 90. Furthermore, the disk portion 82 is provided with positioning bosses 92 projecting from the disk portion 82 toward the first case segment 50 side at positions corresponding to the positioning recessed portions 80 of the first case segment 50.

The sensor body 14 configured to include the magnetic core 34, the circuit board 38, and the case 40 as shown in FIG. 2 is assembled to the bus bar 12 as follows. First, the detection target portion 16 of the bus bar 12 is inserted through the magnetic core 34 through the gap portion 42 of the magnetic core 34. It should be noted that although the detection target portion 16 has a width dimension w (see FIG. 5) that is larger than the gap portion 42, the height dimension h (see FIG. 5) of the detection target portion 16 including the raised portion 20 is made smaller than the gap portion 42, and therefore, it is possible to insert the detection target portion 16 through the magnetic core 34 by inserting the raised portion 20 side of the detection target portion 16 into the gap portion 42.

Next, by bringing the straight edge portion 70 side of the first case segment 50 near the detection target portion 16 and inserting the detection target portion 16 into the opening portion 76a having a cut-out shape and the hollow insertion hole 68 from a direction orthogonal to the direction in which the detection target portion 16 extends, the detection target portion 16 is inserted through the opening portion 76a and the hollow insertion hole 68. Then, the supporting portion 56 is inserted through the magnetic core 34 in a state where the gap portion 42 of the magnetic core 34 is aligned with the substrate-attaching portion 60 of the first case segment 50. The supporting portion 56 is inserted through the magnetic core 34 with the core-supporting ribs 58 coming into contact with the inner circumferential surface of the magnetic core 34. Thereby, the magnetic core 34 is assembled to the first case segment 50 in a state where the magnetic core 34 is supported by the supporting portion 56 and the substrate-attaching portion 60 is inserted into the gap portion 42.

Figure 8:
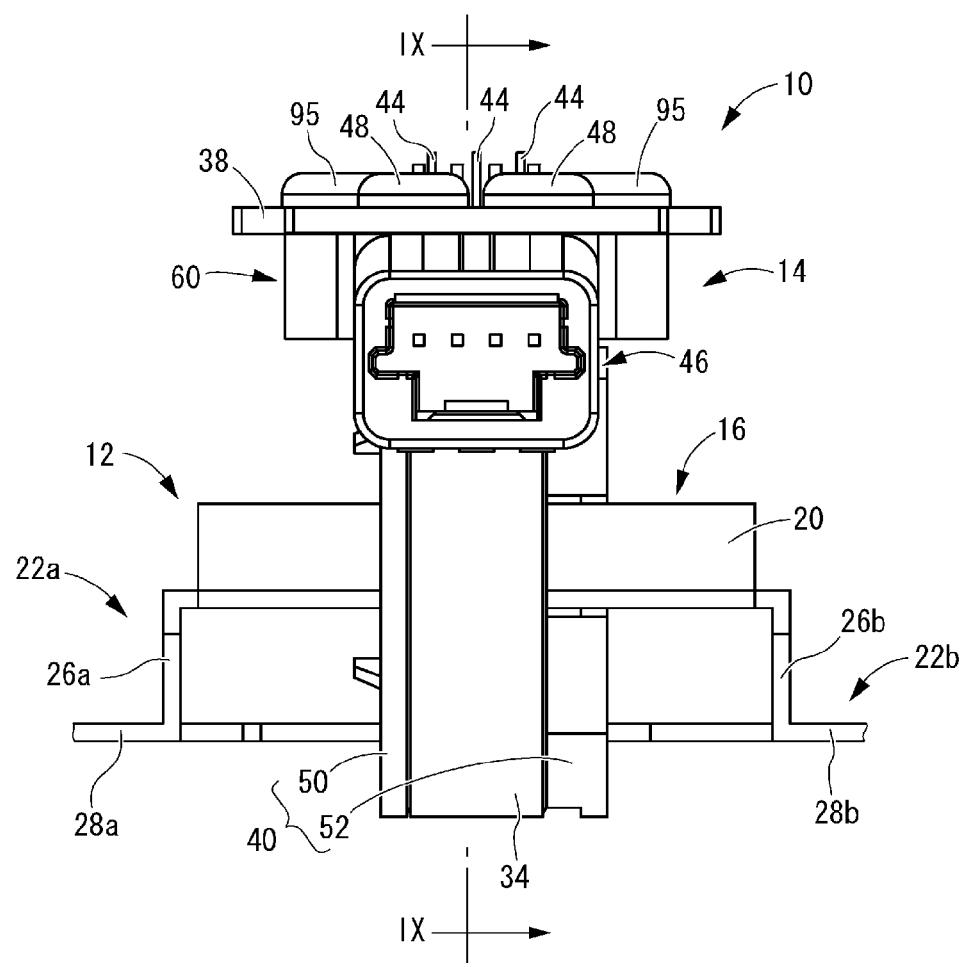
FIG. 8 is an enlarged view of the main part of the front surface of the current sensor shown in FIG. 1.

Next, by bringing the second case segment 52 near the detection target portion 16 from a side opposite to the first case segment 50 in a direction orthogonal to the direction in which the detection target portion 16 extends and inserting the detection target portion 16 into the opening portion 76b having a cut-out shape, the detection target portion 16 is inserted through the opening portion 76b. Then, the locking pieces 88 of the second case segment 52 are inserted into the lock insertion holes 78 of the first case segment 50 and the positioning bosses 92 are fitted to the positioning recessed portions 80 to be positioned, and then the locking claws 90 engage with fitting portions (not shown) formed inside the lock insertion holes 78. Thereby, the first case segment 50 and the second case segment 52 are assembled to each other while the magnetic core 34 is interposed therebetween from both sides in the direction in which the detection target portion 16 extends, and the magnetic core 34 is accommodated in the case 40 constituted by the first case segment 50 and the second case segment 52. It should be noted that the supporting portion 56 of the first case segment 50 that has been inserted through the magnetic core 34 slightly projects from the magnetic core 34 and is fitted into the fitting recess 84 of the second case segment 52. Then, the detection target portion 16 of the bus bar 12 is inserted through the case 40 through the opening portions 76a and 76b of the case 40 and inserted through the magnetic core 34, and both end portions in the direction in which the detection target portion 16 extends project from the opening portions 76a and 76b toward the outside of the case 40. The opening portion 76a of the first case segment 50 and the opening portion 76b of the second case segment 52 are open toward the directions opposite to each other, and therefore, by interposing the detection target portion 16 between the first case segment 50 and the second case segment 52 from both sides, it is possible to prevent the case 40 from being dislodged from the detection target portion 16. Moreover, by interposing the magnetic core 34 between the first case segment 50 and the second case segment 52 from both sides in the axis direction (horizontal direction in FIG. 8, which will be described later), it is possible to stably hold the magnetic core 34.

Figure 7:
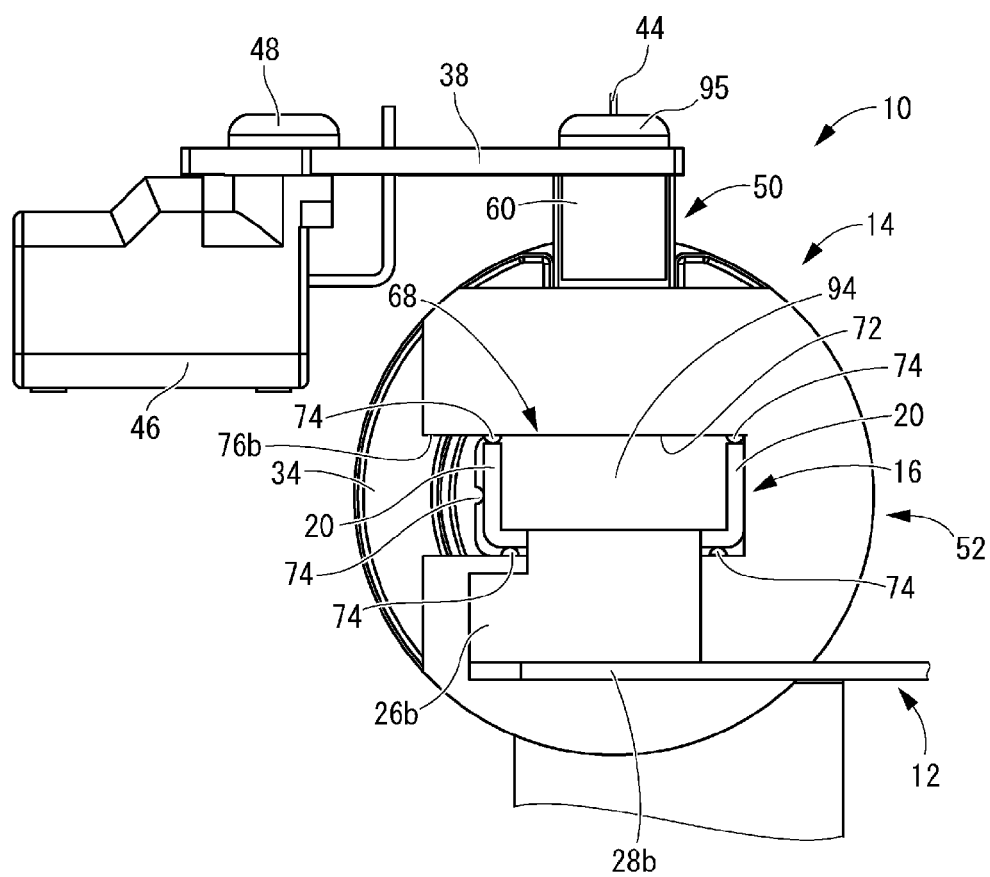
FIG. 7 is an enlarged view of the main part of the side surface of the current sensor shown in FIG. 1.

After the Hall element 36 is inserted into the element-accommodating portion 62 of the first case segment 50, the circuit board 38 on which the connector 46 has been mounted in advance is stacked on the substrate-attaching portion 60 and fixed to the substrate-attaching portion 60 by bolts 95 in a state where the connecting terminals 44 of the Hall element 36 are inserted through holes of the circuit board 38. Thereafter, the connecting terminals 44 of the Hall element 36 are soldered to the circuit board 38. By soldering the Hall element 36 to the circuit board 38 after the Hall element 36 is inserted into the element-accommodating portion 62, it is possible to prevent the Hall element 36 from being fixed in a state where the Hall element 36 is pressed against the bottom surface of the element-accommodating portion 62. Thereby, the Hall element 36 is accommodated in the element-accommodating portion 62 of the case 40 and is disposed inside the gap portion 42 of the magnetic core 34. As described above, as shown in FIG. 7 to FIG. 9, the sensor body 14 is assembled and the detection target portion 16 of the bus bar 12 is inserted through the opening portions 76a and 76b of the case 40 and the magnetic core 34, and thus the current sensor 10 is assembled.

In this current sensor 10, the magnetic flux generated by current flowing through the detection target portion 16 of the bus bar 12 converges on the magnetic core 34, and thus a magnetic field is generated in the gap portion 42. The intensity of the magnetic field in the gap portion 42 that changes depending on the current flowing through the detection target portion 16 is detected by the Hall element 36 disposed in the gap portion 42 and is converted to voltage signals, and thus it is possible to detect the intensity of the current flowing through the detection target portion 16. The voltage signals generated by the Hall element 36 are amplified by an amplifier circuit (not shown) provided on the circuit board 38, for example, and are transferred to a control device such as an electronic control unit through the connector 46.

In the current sensor 10 having a structure according to this embodiment, both of the opening portions 76a and 76b of the first case segment 50 and the second case segment 52 constituting the case 40 have a cut-out shape. Thereby, it is possible to assemble both case segments 50 and 52 to the detection target portion 16 of the bus bar 12 from the horizontal direction (a direction orthogonal to the direction in which the detection target portion 16 extends, that is, a horizontal direction in FIG. 7). By inserting the detection target portion 16 through the magnetic core 34 through the gap portion 42 of the magnetic core 34, it is possible to insert the detection target portion 16 through the opening portions 76a and 76b of the case 40 and the magnetic core 34. Accordingly, even if the bus bar 12 has a complicated shape in which the bent portions 26a and 26b and the wide portions 28a and 28b are included in portions other than the detection target portion 16 and the detection target portion 16 is difficult to be inserted through an opening portion having a shape of a through hole, it is possible to assemble the sensor body 14 to the detection target portion 16 and to assemble the current sensor 10.

Since the connecting portions 24a and 24b connected to connecting terminals of electric wires or the like are formed integrally with the bus bar 12, it becomes unnecessary to connect the bus bar projecting from the case to other bus bars as in a current sensor having a conventional structure. Accordingly, it is possible to prevent the problem of the heat generation due to the contact resistance between the bus bars and to suppress a rise in temperature of the detection target portion 16. As a result, it is possible to reduce the influence of heat on the Hall element 36 and to stably secure a favorable detection accuracy. Moreover, since the overall dimensions of the bus bar 12 are made larger and thus the heat is distributed extensively, it is possible to suppress a rise in temperature of the detection target portion 16. Furthermore, since the connecting portions 24a and 24b are formed integrally with the bus bar 12, it becomes unnecessary to connect the detection target portion 16 to other bus bars and to control the contact pressure between the detection target portion 16 and other bus bars, and therefore, it is possible to reduce production man-hours.

Moreover, by forming the raised portions 20 in the detection target portion 16 and making the surface area and the conductive cross-sectional area of the detection target portion 16 larger, the heat-radiating effect is improved. Furthermore, since the hollow insertion hole 68 has a rectangular cross section surrounding the entire cross-sectional shape of the detection target portion 16, a hollow portion 94 is formed between the inner surface 72 of the hollow insertion hole 68 and the detection target portion 16. By bringing the detection target portion 16 into contact with air in the hollow portion 94, it is possible to attain a better heat-radiating effect and to suppress a rise in temperature of the detection target portion 16.

Figure 9:
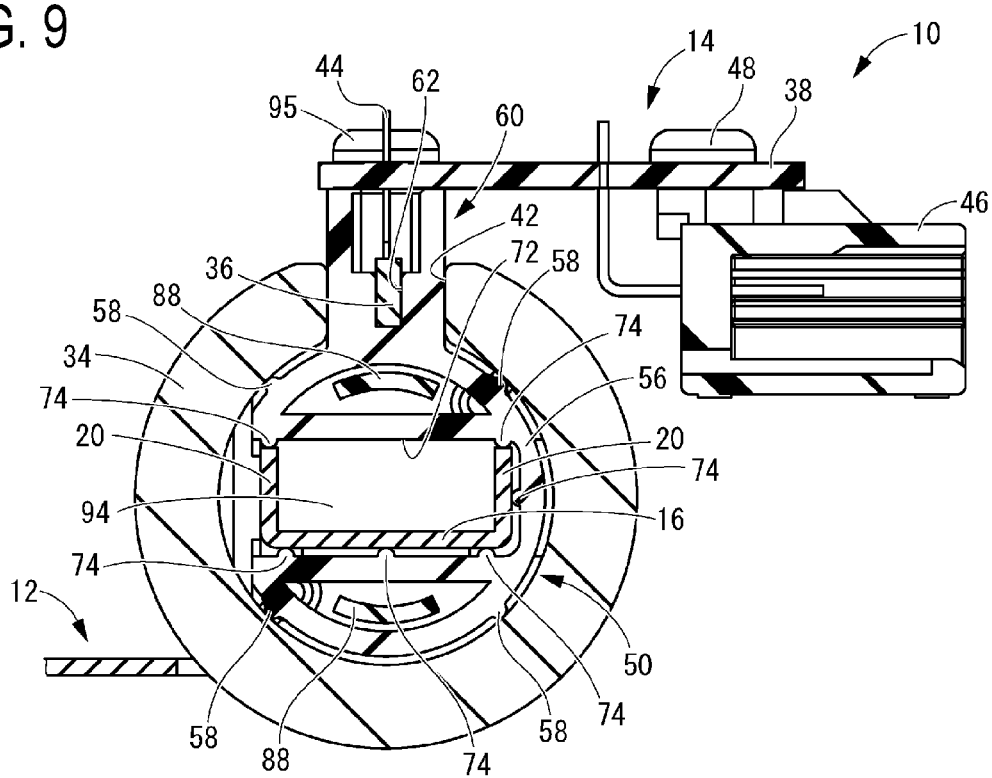
FIG. 9 is a cross-sectional view taken along line IX-IX shown in FIG. 8.

Furthermore, as is clear from FIG. 9, the inner surface 72 of the hollow insertion hole 68 is provided with the bus bar-supporting ribs 74, and the detection target portion 16 is disposed so as to have a space or gap toward the inner surface 72. Thereby, it is possible to reduce the heat transfer from the detection target portion 16 to the case 40, and therefore, it is possible to reduce the influence of heat on the Hall element 36. Furthermore, the outer surface of the supporting portion 56 is provided with the core-supporting ribs 58, and the magnetic core 34 is disposed so as to have a gap toward the supporting portion 56. Thereby, it is also possible to reduce the heat transfer from the case 40 to the magnetic core 34, and therefore, it is possible to further reduce the influence of heat on the Hall element 36.

It should be noted that the current sensor of the e exemplary embodiment may be a current sensor that is integrally formed with a bus bar as the above-described embodiment or a current sensor that includes no bus bar and is constituted by only the sensor body 14 of the above-described embodiment. That is, the exemplary embodiments also include a current sensor that is constituted by the sensor body 14 and can be attached to any bus bar. With the current sensor constituted by only that sensor body 14, even if the bus bar to which the sensor body 14 is attached is large, it is possible to attach the sensor body 14 to any position in the direction in which the bus bar extends by assembling the case segments 50 and 52 from the cutouts of the opening portions 76a and 76b without dividing the bus bar. Therefore, in the current sensor constituted by only the sensor body 14 as well, it becomes unnecessary to connect both ends of the bus bar that project from the case as in a current sensor having a conventional structure between the divided bus bars, and it is possible to solve the problem of the heat generation due to the contact resistance in the connecting portions.

Figure 10:
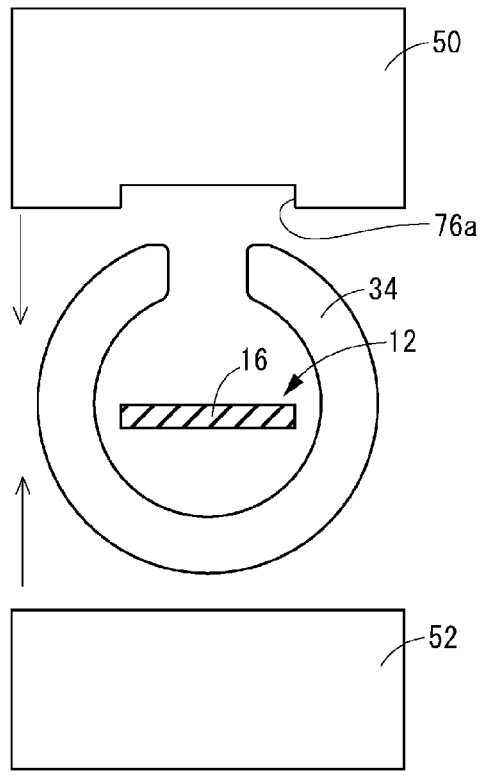
FIG. 10 is a diagram illustrating a current sensor according to another aspect of the exemplary embodiments.

While the exemplary embodiment has been described in detail, the exemplary embodiment is not limited to the specific description in this application. A divided structure of the case is not limited to that of the above-described embodiment, and the opening portion of the case may be formed on only either one of the first case segment and the second case segment. For example, as shown in FIG. 10 using the same reference numerals as those in the above-described embodiment, the first case segment 50 and the second case segment 52 may be assembled to each other from both sides in a direction orthogonal to the axis of the magnetic core 34 (vertical direction in FIG. 10), and only the first case segment 50 may be provided with the opening portion 76a having a cut-out shape that is open toward the second case segment 52 whereas the second case segment 52 may be provided with no opening portion 76b. By interposing the magnetic core 34 through which the detection target portion 16 of the bus bar 12 is inserted between the first case segment 50 and the second case segment 52 from both sides in a direction orthogonal to the direction in which the detection target portion 16 extends (vertical direction in FIG. 10), which is the direction orthogonal to the axis of the magnetic core 34, the detection target portion 16 may be inserted into the opening portion 76a of the first case segment 50 and the opening of the cutout of the opening portion 76a may be blocked by the second case segment 52, for example.

Moreover, as is clear from FIG. 10, the raised portions 20 formed in the detection target portion 16 of the bus bar 12 in the above-described embodiment are not necessarily needed, and the detection target portion 16 may have a flat plate shape that extends with a rectangular cross section. The cross-sectional shape of the hollow insertion hole 68 can be set as appropriate depending on the cross-sectional shape of the detection target portion 16, and is not necessarily made larger to an extent that the hollow portion 94 can be formed compared with the cross-sectional shape of the detection target portion 16 as in the above-described embodiment. Accordingly, the hollow insertion hole 68 may have a cross section having a shape substantially similar to the cross-sectional shape of the detection target portion 16 with a size allowing the detection target portion 16 to be inserted therethrough, and form no hollow portion 94.

Moreover, although the circuit board 38 including the Hall element 36 is disposed outside the case 40 in the above-described embodiment, the circuit board 38 may be disposed to be accommodated in the case 40. Furthermore, the shape of the magnetic core is not limited to an annular shape, and may be a rectangular ring shape or the like.

LIST OF REFERENCE NUMERALS

10: current sensor,
12: bus bar,
14: sensor body,
16: detection target portion,
18: bending line,
20: raised portion,
22a, b: conductive path,
24a, b: connecting portion,
34: magnetic core,
36: Hall element (magneto-electric conversion element),
40: case,
42: gap portion,
50: first case segment,
52: second case segment,
56: supporting portion,
58: core-supporting rib,
68: hollow insertion hole,
72: inner surface,
74: bus bar-supporting rib,
76a, b: opening portion,
94: hollow portion

The invention claimed is:

1. A current sensor comprising:
an annular magnetic core including a gap portion formed by cutting out a portion of a circumference of the annular magnetic core;
a bus bar having a detection target portion inserted through the gap portion of the annular magnetic core such that the detection target portion passes through the annular magnetic core;
a magneto-electric conversion element disposed in the gap portion of the annular magnetic core, the magneto-electric conversion element being configured to detect a magnetic flux based on a current flowing through the detection target portion of the bus bar; and
a case accommodating the annular magnetic core and the magneto-electric conversion element, the case having an opening portion configured such that the detection target portion of the bus bar projects from the case through the opening portion, the case including a first case segment and a second case segment being assembled with the magnetic core interposed between the first and the second case segment, wherein:
at least one of the first case segment and the second case segment is provided with the opening portion, the opening portion having a cut-out shape that is open in a direction orthogonal to a direction in which the detection target portion extends,
the first case segment and the second case segment are assembled to each other by inserting the detection target portion into the opening portion in the direction orthogonal to the direction in which the detection target portion extends,
the magnetic core is interposed between the first and the second case segment in the direction in which the detection target portion of the bus bar extends, and
both of the first case segment and the second case segment are provided with the opening portions, the respective opening portions being open toward directions that are opposite to each other and orthogonal to the direction in which the detection target portion extends, and the first case segment and the second case segment are assembled to each other by inserting the detection target portion into the opening portions from mutually opposite sides interposing the detection target portion in the direction orthogonal to the direction in which the detection target portion extends.

2. The current sensor according to claim 1, wherein the bus bar includes: (i) connecting portions that are integrally formed on both sides of the detection target portion, and (ii) conductive paths connecting the connecting portions and the detection target portion, the conductive paths being larger than the opening portions of the case in a projection view in the direction in which the detection target portion extends.

3. The current sensor according to claim 1, wherein
the detection target portion is provided with raised portions that are raised from the detection target portion and extend in the direction in which the detection target portion extends.

4. The current sensor according to claim 1, wherein the bus bar includes: (i) connecting portions that are integrally formed on both sides of the detection target portion, and (ii) conductive paths connecting the connecting portions and the detection target portion, the conductive paths being larger than the opening portions of the case in a projection view in the direction in which the detection target portion extends.

5. The current sensor according to claim 1, wherein the detection target portion is provided with raised portions that are raised from the detection target portion and extend in the direction in which the detection target portion extends.

6. The current sensor according to claim 2, wherein the detection target portion is provided with raised portions that are raised from the detection target portion and extend in the direction in which the detection target portion extends.

7. The current sensor according to claim 1, wherein the first case segment includes: (i) a supporting portion, and (ii) at least one bus-bar supporting rib that extends along a longitudinal length of the supporting portion of the first case segment.

8. The current sensor according to claim 7, wherein the at least one bus-bar supporting rib is configured to form a space between the detection target portion and an inner surface of the opening portion.

* * * * *